(12) United States Patent
Banks et al.

(10) Patent No.: US 8,329,303 B2
(45) Date of Patent: *Dec. 11, 2012

(54) CONTROLLED ATMOSPHERE WHEN SINTERING A FRIT TO A GLASS PLATE

(75) Inventors: Andrew Douglas Banks, Corning, NY (US); Heather Debra Boek, Corning, NY (US); Jason Arthur Howles, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/406,950

(22) Filed: Feb. 28, 2012

(65) Prior Publication Data

US 2012/0156406 A1 Jun. 21, 2012

Related U.S. Application Data

(62) Division of application No. 12/156,202, filed on May 30, 2008, now Pat. No. 8,147,632.

(51) Int. Cl.
*B32B 17/00* (2006.01)
*E06B 3/00* (2006.01)
*H01J 1/62* (2006.01)

(52) U.S. Cl. .......... 428/432; 428/34; 428/433; 313/512; 501/15; 501/21; 501/152

(58) Field of Classification Search .......... 428/34, 428/426, 432, 433; 313/495–497, 512; 501/15, 501/21, 152
See application file for complete search history.

(56) References Cited

U.S. PATENT DOCUMENTS

| 6,929,523 | B2 | 8/2005 | Ishii et al. | 445/23 |
|---|---|---|---|---|
| 6,998,776 | B2 | 2/2006 | Aitken et al. | 313/512 |
| 7,371,143 | B2 | 5/2008 | Becken et al. | 445/25 |
| 7,992,411 | B2 | 8/2011 | Boek et al. | 65/33.6 |
| 8,147,976 | B2 * | 4/2012 | Boek et al. | 428/432 |
| 2004/0000745 | A1 | 1/2004 | Channer | 264/511 |
| 2004/0095597 | A1 | 5/2004 | Lin | 358/1.15 |
| 2007/0090759 | A1 | 4/2007 | Choi et al. | 313/512 |
| 2007/0170850 | A1 | 7/2007 | Choi et al. | 313/506 |
| 2007/0170855 | A1 | 7/2007 | Choi et al. | 313/512 |
| 2007/0170860 | A1 | 7/2007 | Choi et al. | 313/512 |
| 2007/0194687 | A1 | 8/2007 | Wilczek et al. | 313/495 |
| 2007/0247068 | A1 | 10/2007 | Park | 313/512 |
| 2008/0090034 | A1 | 4/2008 | Harrison et al. | 428/32.71 |

FOREIGN PATENT DOCUMENTS

| EP | 1811570 | 7/2007 |
|---|---|---|
| EP | 1811571 | 7/2007 |
| EP | 1811587 | 7/2007 |
| EP | 1811588 | 7/2007 |
| EP | 1811589 | 7/2007 |
| EP | 1811590 | 7/2007 |
| EP | 1814179 | 8/2007 |
| EP | 1814180 | 8/2007 |
| EP | 1814186 | 8/2007 |
| WO | 04/000745 | 12/2003 |

* cited by examiner

*Primary Examiner* — Donald J Loney
(74) *Attorney, Agent, or Firm* — Kevin M. Able; William J. Tucker

(57) ABSTRACT

A method is described herein for controlling the oxygen level within an oven while sintering a frit to a glass plate where the sintered frit and glass plate are subsequently sealed to another glass plate to form a sealed glass package. Examples of the sealed glass package include a light-emitting device (e.g., organic light emitting diode (OLED) device), a photovoltaic device, a food container, and a medicine container.

2 Claims, 3 Drawing Sheets

CONTROLLED ATMOSPHERE WHEN SINTERING A FRIT TO A GLASS PLATE

CROSS REFERENCE TO RELATED APPLICATION

This is a divisional of U.S. patent application Ser. No. 12/156,202 filed on May 30, 2008 now U.S. Pat. No. 8,147,632, which is related to U.S. patent application Ser. No. 12/156,377 filed on May 30, 2008, entitled "Method for Sintering a Frit to a Glass Plate", now U.S. Pat. No. 7,992,411, the contents of which are relied upon and incorporated herein by reference in their entirety, and the benefit of priority under 35 U.S.C. §120 is hereby claimed.

TECHNICAL FIELD

The present invention relates to a method for controlling the oxygen level within an oven while sintering a frit to a glass plate where the sintered frit and glass plate are subsequently sealed to another glass plate to form a sealed glass package. Examples of the sealed glass package include a light-emitting device (e.g., organic light emitting diode (OLED) device), a photovoltaic device, a food container, and a medicine container.

BACKGROUND

Manufacturers of sealed glass packages such as OLED displays (for example) are constantly trying to improve the manufacturing process to more efficiently produce the sealed glass packages. One way to improve the manufacturing process by controlling the oxygen level within an oven when sintering a frit to a glass plate where the sintered frit and glass plate are subsequently sealed to another glass plate to produce a sealed glass package is the subject of the present invention.

SUMMARY

In one aspect, the present invention includes a method for sintering a frit to a glass plate by: (a) providing the glass plate; (b) depositing a frit onto the glass plate; (c) placing the glass plate with the deposited frit into an oven; (d) sintering the frit to the glass plate within the oven by: (i) ramping-up a temperature within the oven to a predetermined temperature, where the predetermined temperature is higher than a glass transition temperature ($T_g$) of a glass in the frit but less than a crystallization temperature of the glass in the frit; (ii) holding the predetermined temperature within the oven for a predetermined time; and (iii) maintaining an oxygen level within the oven at a predetermined level within a range of about 1,200 ppm-22,220 ppm while holding the predetermined temperature within the oven for the predetermined time; and (e) ramping-down a temperature within the oven; and (f) removing the glass plate with the sintered frit from the oven.

In another aspect, the present invention includes a method for sealing a glass package by: (a) providing a first glass plate and a second glass plate; (b) depositing a frit onto the first glass plate, where the frit includes a glass, a filler and a dispersant vehicle; (c) placing the first glass plate with the deposited frit into an oven; (d) sintering the frit to the first glass plate within the oven by: (i) ramping-up a temperature within the oven from a first temperature to a second temperature by a first ramp rate with a predetermined temperature/predetermined time; (ii) holding the second temperature within the oven for a predetermined time, where the second temperature is high enough to volatize organic ingredients within the dispersant vehicle in the frit but not higher than a glass transition temperature ($T_g$) of the glass in the frit; (iii) ramping-up a temperature within the oven from the second temperature to a third temperature by a second ramp rate with a predetermined temperature/predetermined time; (iv) holding the third temperature within the oven for a predetermined time, where the third temperature is higher than the glass transition temperature ($T_g$) of the glass in the frit but less than a crystallization temperature of the glass in the frit; (v) maintaining an oxygen level within the oven at a predetermined level located within a range of about 1,200 ppm-22,220 ppm while holding the third temperature within the oven for the predetermined time; (vi) ramping-down a temperature within the oven from the third temperature to a fourth temperature by a third ramp rate with a predetermined temperature/predetermined time; (vii) ramping-down a temperature within the oven from the fourth temperature to a fifth temperature by a fourth ramp rate with a predetermined temperature/predetermined time; and (e) removing the first glass plate with the frit from the oven; (f) placing the second glass plate on the frit attached to the first glass plate; and (g) using a sealing device at a predetermined sealing power to heat the frit such that the frit melts and forms a seal which connects the first glass plate to the second glass plate.

In yet another aspect, the present invention includes a sealed glass package comprising a first glass plate and second glass plate that are connected to one another by a transition metal-lanthanide doped glass frit which formed a seal between the first glass plate and the second glass plate, wherein the transition metal-lanthanide doped glass frit has a predetermined color and desired oxidation state due to a using an 1,200 ppm-22,220 ppm oxygen controlled atmosphere sintering process which was performed to attach the transition metal-lanthanide doped glass frit to the first glass plate before the second glass plate was placed on top of the sintered transition metal-lanthanide doped glass frit and the sintered transition metal-lanthanide doped glass frit was melted to form the seal between the first glass plate and the second glass plate (note: the term transition metal-lanthanide doped glass frit includes a transition metal doped glass frit, a lanthanide doped glass frit or a transition metal and lanthanide doped glass frit).

Additional aspects of the invention will be set forth, in part, in the detailed description, figures and any claims which follow, and in part will be derived from the detailed description, or can be learned by practice of the invention. It is to be understood that both the foregoing general description and the following detailed description are exemplary and explanatory only and are not restrictive of the invention as disclosed.

BRIEF DESCRIPTION OF THE DRAWINGS

A more complete understanding of the present invention may be had by reference to the following detailed description when taken in conjunction with the accompanying drawings wherein.

DETAILED DESCRIPTION

Figure 1A:
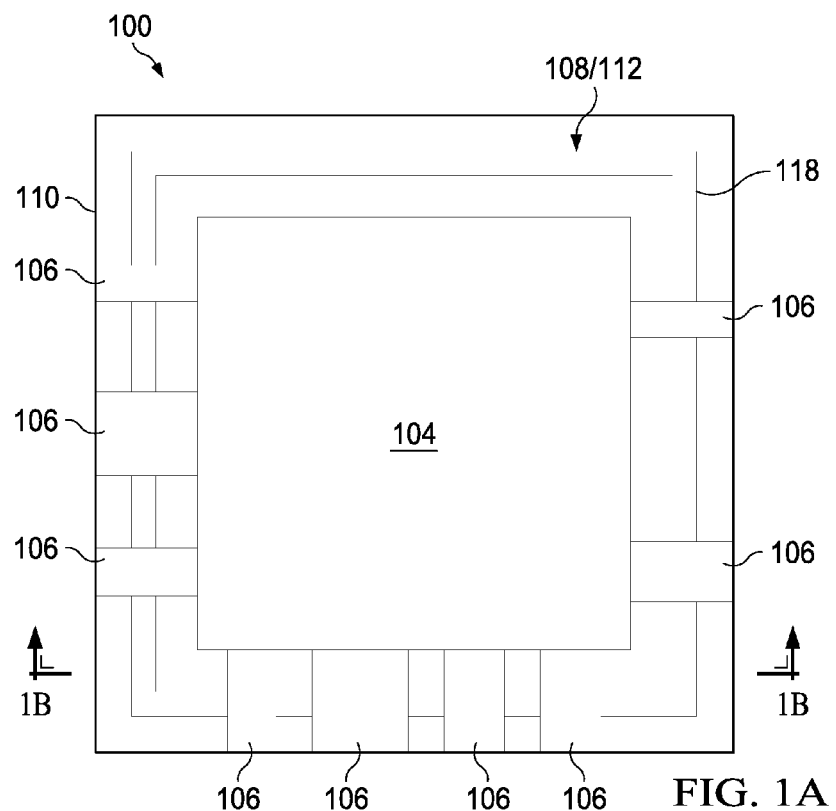
FIGS. 1A and 1B respectively illustrate a top view and a cross-sectional side view of a sealed glass package in accordance with an embodiment of the present invention.
Figure 1B:
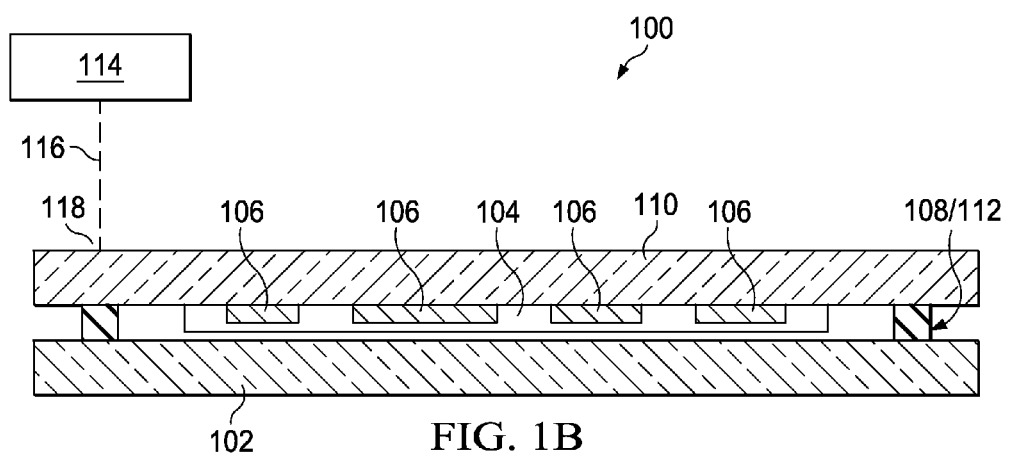
Figure 2:
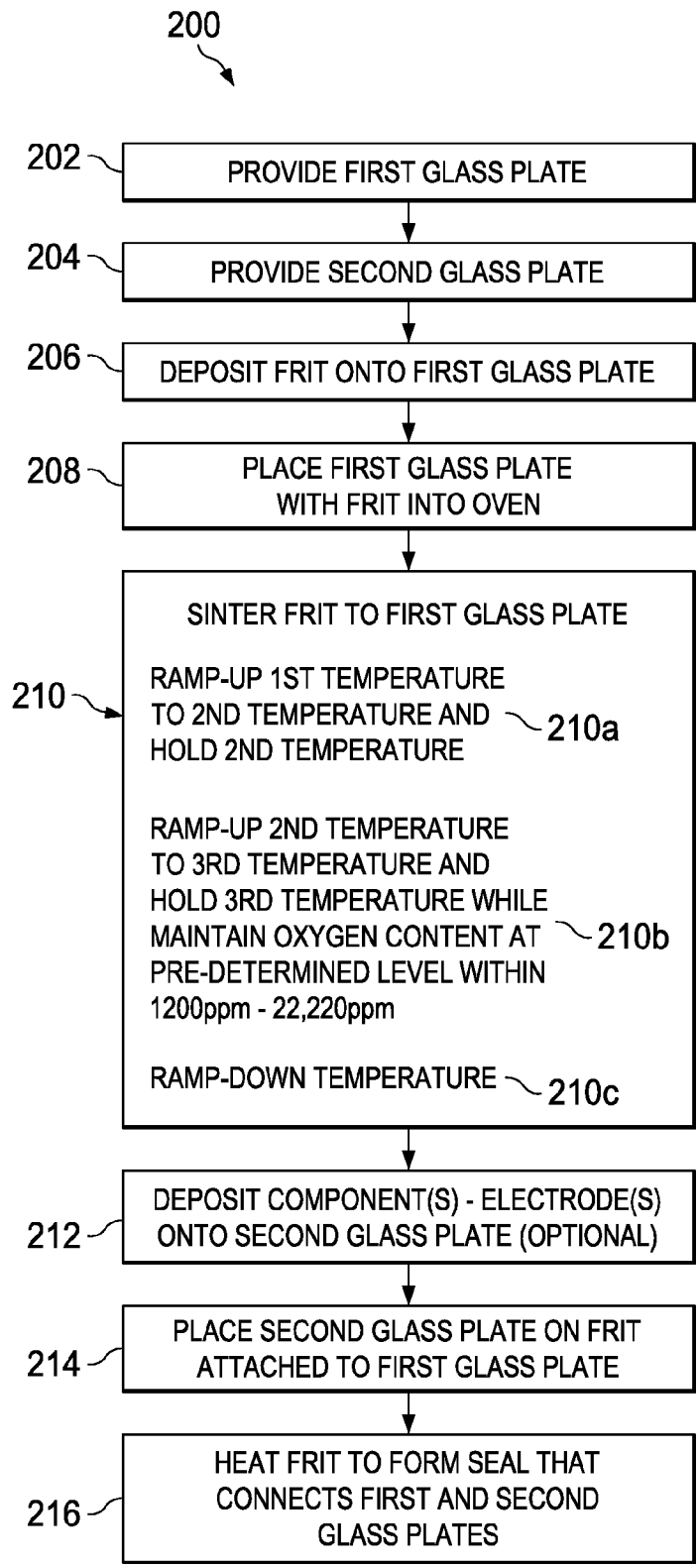
FIG. 2 is a flowchart illustrating the steps of a method for manufacturing the sealed glass package in accordance with an embodiment of the present invention.

Referring to FIGS. 1-2, there are disclosed a sealed glass package 100 and a method 200 for sealing the glass package 100 using an oxygen controlled atmosphere controlled sintering process in accordance with an embodiment of the present invention. The sealing method 200 is described below with respect to sealing a glass package 100 that includes two glass plates 102 and 110 that are bonded to one another by a frit 108 and where the two glass plates 102 and 110 contain one or more components 104. Examples of the sealed glass package 100 include a light-emitting device 100 (e.g., organic light emitting diode (OLED) device 100), a photovoltaic device 100, a food container 100, and a medicine container 100. However, the present invention should not be construed as being limited to any specific type of sealed glass package 100.

Referring to FIGS. 1A and 1B, there are respectively shown a top view and a cross-sectional side view illustrating the basic components of the sealed glass package 100 in accordance an embodiment of with the present invention. The sealed glass package 100 includes a first glass plate 102, one or more components-electrodes 104 and 106 (optional), a frit 108 and a second glass plate 110. The sealed glass package 100 has a seal 112 (e.g., hermetic seal 112) formed from the frit 108 which contains and protects the one or more components 104 (if present) located between the first glass plate 102 and the second glass plate 110. The electrode(s) 106 (if present) are connected to the component(s) 104 and also pass through the seal 112 so they can be connected to an external device (not shown). The seal 112 is typically located around the perimeter of the glass package 100 such that the component(s) 104 (if present) and at least a part of the electrode(s) 106 (if present) are located within the perimeter of the seal 112. How the glass package 100 is manufactured using the oxygen controlled atmosphere sintering process and the ancillary components such as the sealing device 114 (e.g., laser 114 and/or infrared lamp 114) are described in greater detail below with respect to FIGS. 2-4.

Referring to FIG. 2, there is a flowchart illustrating the steps of the method 200 for manufacturing the sealed glass package 100 in accordance with an embodiment of the present invention. Beginning at steps 202 and 204, the first glass plate 102 and the second glass plate 110 are provided so that one can make the sealed glass package 100. In one embodiment, the first and second glass plates 102 and 110 are transparent glass plates such as soda lime glass plates or alkaline-earth alumino borosilicate glass plates like the ones manufactured and sold by Corning Incorporated under the brand names of Code 1737 glass, Eagle 2000™ glass, and Eagle XG™ glass. Alternatively, the first and second glass plates 102 and 110 can be transparent glass plates like the ones manufactured and sold by companies such as Asahi Glass Co. (e.g., OA10 glass and OA21 glass), Nippon Electric Glass Co., NHTechno and Samsung Corning Precision Glass Co. (for example). If desired, either or both of the glass plates 102 and 110 could be non-transparent. In addition, the glass plates 102 and 110 could have a coefficient of thermal expansion (CTE) in the range of $30\text{-}110\times10^{-7}$ per degree centigrade (° C.).

At step 206, the frit 108 is deposited along the edges of the first glass plate 102 in a manner that the frit 108 forms a closed-loop on a surface of the first glass plate 102. For instance, the frit 108 can be placed approximately 1 mm away from the free edges of the first glass plate 102. The frit 108 is made from a glass (e.g., glass doped with at least one transition metal like iron, copper, vanadium, and neodymium), a filler (e.g., inversion filler, additive filler), and a dispersant vehicle. The filler is typically used to lower the coefficient of thermal expansion (CTE) of the frit 108 so that it matches or substantially matches the CTEs of the two glass plates 102 and 110. In one embodiment, the frit 108 is made of a blend of powdered antimony-vanadate-phosphate glass with β-eucryptite filler that have particle sizes on average below 10 μm or, preferably, less than or equal to 3 μm. And, the dispersant vehicle may be a blend of 2, 2, 4-trimethyl-1, 3-pentadiol monoisobutyrate (brandname of Texanol) and other dispersants (e.g., Anti-Terra, BYK, Solsperse and ethylcellulose) which do not evaporate quickly and keep the solids in suspension between the time that the frit 108 is dispensed onto the first glass plate 102 until it is sintered. The compositions of several different exemplary frits 108 which could be used in this particular application with the addition of the dispersant vehicle have been discussed in a co-assigned U.S. Pat. No. 6,998,776 entitled "Glass Package that is Hermetically Sealed with a Frit and Method of Fabrication". The contents of this document are hereby incorporated by reference herein.

At step 208, the first glass plate 102 with the deposited frit 108 is placed into an oven. In one embodiment, the oven can heat-up to temperatures of 400-450° C. while located in a clean room (e.g., Class 1000 clean room). The oven can be electric or gas fired (typically natural gas) and can be made by various manufacturers such as, for example, Blue M, Lindbergh, Glenro, Despatch, HIX, Smit, Thermatrol, Epcon Industrial Systems, Gruenberg, Intek, and Lewco. An electric oven is desirable since it is much cleaner than a gas fired oven. The electric oven can utilize resistance heating elements to heat the air and transfer that energy via a convection type heating to the frit 108 and glass sheet 102. Another type of oven that could be used utilizes infrared heating to directly heat the frit 108 and glass sheet 102. In fact, some ovens can use different combinations of these heating methods to heat the frit 108 and glass sheet 102. Alternatively, continuous type sintering ovens with belts, pushers and lehrs can be used to heat the frit 108 and glass plate 102. The continuous type sintering ovens would have different zones through which the frits 108 and glass plates 102 would travel.

At step 210, the frit 108 is sintered to the first glass plate 102 while within the oven where the frit 108 is heated and becomes attached to the first glass plate 102. In particular, the frit 108 is sintered to the first glass plate 102 using an oxygen controlled atmosphere sintering process in accordance with an embodiment of the present invention which takes less than 8 hours, preferably less than 6 hours and more preferably less than 3.25 hours. The exemplary oxygen controlled atmosphere sintering process 210 has multiple steps where first the temperature within the oven is ramped-up from a first temperature to a second temperature, where the second temperature is high enough to volatize organic ingredients within the dispersant vehicle of the frit 108 but not higher than a glass transition temperature ($T_g$) of the glass in the frit 108. The second temperature is held for a predetermined time and before the end of the predetermined time an inert gas supply (e.g., $N_2$ gas supply, He gas supply) or a reducing gas supply (e.g., $H_2$ gas supply) is turned-on to displace a desired amount of the air located within the oven (step 210a). Second, the temperature within the oven is ramped-up from the second temperature to a third temperature, where the third temperature is higher than the glass transition temperature ($T_g$) of the glass in the frit 108 but less than a crystallization temperature of the glass in the frit 108. The third temperature is held for a predetermined time while at the same time maintaining an oxygen level within the oven at a predetermined level somewhere within a range of about 1,200 ppm-22,220 ppm (step 210b). Thirdly, the temperature within the oven is ramped-down at a predetermined rate to prevent the cracking of the first glass plate 102 with the sintered frit 108 (step 210c). If desired, the sintered frit 108 can be ground to reduce its thickness variation to less than 5-10 μm (for example). An alternative oxygen controlled atmosphere sintering process 210 that can be used in this particular application is described below with respect to several experimentally tested glass packages 100. Of course, the alternative oxygen controlled atmosphere sintering processes 210 can be implemented to make other types of sealing glass packages 100 and not just the experimentally tested glass packages 100.

At step 212 (optional), the components 104 (e.g., OLEDs 104, food 104, medicine 104) and associated electrodes 106 (if needed) are deposited onto the second glass plate 110. This step can be omitted if the sealed glass package 100 is not supposed to contain components-electrodes 104 and 106 but instead will contain only a liquid or gas.

At step 214, the second glass plate 110 is placed on the frit 108 that has been attached to the first glass plate 102. For instance, the second glass plate 110 can be placed on top of the frit 108 attached to the first glass plate 102. Or, the first glass plate 102 with the attached frit 108 can be placed on top of the second glass plate 110.

At step 216, the frit 108 may be heated by the sealing device 114 (e.g., laser 114, infrared lamp 114) in a manner such that the frit 108 melts and forms the seal 112 (e.g., hermetic seal 112) which bonds the first glass plate 102 to second glass plate 110 (see FIG. 1B). In addition, the seal 112 protects the component(s) 104 (if any) by preventing, for example, oxygen and moisture located in the ambient environment from entering into the sealed glass package 100. Typically, the frit 108 contains a glass doped with one or more transition metals (e.g., vanadium, iron) and/or a lanthanide (e.g., Nd) so as to enhance its absorption property at the specific wavelength (e.g., 810 nm wavelength) of the light 116 (e.g., laser beam 116) emitted from the sealing device 114 (e.g., laser 114) (see FIGS. 1A-1B). This enhancement of the absorption property of the frit 108 means that the emitted light 116 will be absorbed better by the frit 108 so it will be heated and soften and form the seal 112 (hermetic seal 112). In contrast, the glass plates 102 and 110 should be chosen such that they do not absorb much, if any, irradiation from the sealing device 114. Thus, the glass plates 102 and 110 would have a relatively low absorption at the specific wavelength of the light 116 which would help to minimize the undesirable transfer of heat from the forming seal 112 (hermetic seal) to the components-electrodes 104 and 106 (if present).

If desired, the sealing device 114 can be used to emit a light 116 that heats the frit 108 in a manner where a substantially constant temperature is maintained in the frit 108 along a sealing line 118 that has regions free of electrodes 106 and regions occupied by electrodes 106 (if used) while the frit 108 melts and forms the seal 112 which connects the first glass plate 102 to the second glass plate 110. This can be accomplished even if the electrodes 106 absorb or reflect irradiation from the light 116. The constant temperature sealing technique is described in a co-assigned U.S. Pat. No. 7,371,143 entitled "Optimization of Parameters for Sealing Organic Emitting Light Diode (OLED) Displays". The contents of this document are hereby incorporated by reference herein.

Figure 3:
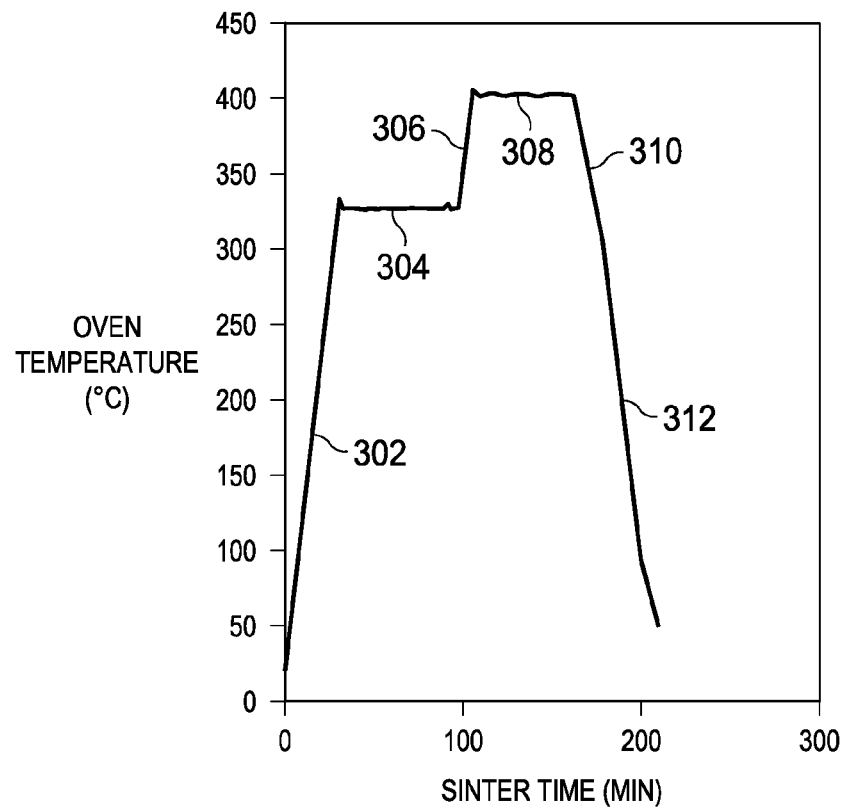
FIG. 3 is a graph which is used to help explain the steps of an oxygen controlled atmosphere sintering process that is used in the method of FIG. 2 in accordance with an embodiment of the present invention.

Referring to FIG. 3, there is a graph which is used to help explain an exemplary oxygen controlled atmosphere sintering process 210 that can be used to sinter a frit 108 to the first glass plate 102 in less than 3.5 hours in accordance with an embodiment of the present invention. Prior to discussing the oxygen controlled atmosphere sintering process 210, it should be understood that an experiment is described below where the frit 108 had a specific composition and the first glass plate 102 had a specific composition but it should be appreciated that different types of frits 108 and different types of glass plates 102 could be attached to one another using the present invention. In addition, the following experiment involved the use of particular steps and a particular sequence of steps but it should be appreciated that any of these steps or the particular sequence of steps may or may not be implemented to attach a frit 108 to a glass plate 110 using the present invention. Accordingly, the oxygen controlled atmosphere sintering process 210 should not be construed as being limited to a specific type of frit 108, a specific type of glass plate 102, a specific step, or a specific sequence of steps.

The following explains the experimental procedure that was used to test an exemplary oxygen controlled atmosphere sintering process 210 of the present invention. The different procedural steps where as follows:

1. Melt Sb—V-phosphate glass and then melt and crystallize the β-eucryptite which is used as the filler. The Sb—V-phosphate glass had the following composition (mol %): $Sb_2O_3$: 23.5%, $V_2O_5$: 47.5%, $TiO_2$: 1%, $Al_2O_3$: 1%, $Fe_2O_3$: 2.5% and $P_2O_5$%: 27%.

2. Grind the Sb—V-phosphate glass and the β-eucryptite filler to a targeted particle size distribution, in these tests, ≦3 um for the glass and 3 um-7 um for the filler.

3. Blend the powders, by weight, 70% Sb—V-phosphate glass and 30% β-eucryptite filler.

4. Make the dispersant vehicle from a blend of 80.5 wt % Texanol+6.5 wt % each of Anti-Terra 202, BYK 354, Solsperse 900+ethylcellulose added on top.

5. Mix the dispersant vehicle and powder blend to make a frit paste 108.

6. Dispense the frit paste 108 into nine orthogonal patterns on a 6"×6" Eagle 2000™ glass plate 102 (see step 206 in FIG. 2).

7. Place the dispensed frit paste 108 and the glass plate 102 into an oven (see step 208 in FIG. 2).

8. Sinter the dispensed frit paste 108 to the glass plate 102 using the following exemplary oxygen controlled atmosphere sintering process 210:

a. Heat 25° C.-325° C. by a ramp rate of 10° C./minute (cumulative time=0.5 hrs) (see step 302 in FIG. 3). This ramp rate is limited by the furnace design and the thermodynamics associated with transferring heat to the glass plate 102 and the frit 108.

b. Hold 1 hour (in air) and 8 minutes ($N_2$ on) at 325° C. (cumulative time=1.6 hrs) (see step 304 in FIG. 3) (note: for the 8 minutes a reducing gas (like hydrogen) or an inert gas (like nitrogen) can be used where the inert gas, rather than reducing the frit paste 108, helps to prevent the transition metal-lanthanide from being oxidized by the oxygen in the air).

c. Heat 325° C.-400° C. by a ramp rate of 10° C./minute (cumulative time=1.75 hrs) (see step 306 in FIG. 3).

d. Hold 1 hour at 400° C. (cumulative time=2.75 hrs) (see step 308 in FIG. 3). In this experiment, the oxygen level content within the oven was maintained at a predetermined level within a range of about 1,200 ppm-22,220 ppm. The following oxygen levels have been tested: 1,200 ppm (0.12%), 7,400 ppm (0.74%) 22,000 ppm (2.2%), 57,000 ppm (5.7%) and 210,000 ppm (21%) (see FIG. 4).

e. Cool 400° C.-300° C. by a ramp rate of 6° C./minute while keeping the oxygen level constant (cumulative time=3 hrs) (see step 310 in FIG. 3).

f. Cool 300° C.-60° C. ($N_2$ off, full air on for cooling) by a ramp rate of 16° C./minute (cumulative time=3.25 hrs) (see step 312 in FIG. 3).

9. Remove the sintered frit 108 and glass plate 102 from the oven.

10. Seal the sintered frit 108 and glass plate 102 to the other glass plate 110 to form the sealed glass package 100 (see step 216 in FIG. 2). In this case, the sealing device 114 (e.g., 810 nm sealing device 114) and associated components had been located in a Class 1000 clean room. Typically, the frit sealing step 216 can be performed under different conditions but in this set-up if the sintered frit 108 is sealed at high speed (e.g., 10-50 mm/minute) and low power (<37 W), then the frit seal 112 will likely be hermetic. The frit sealing conditions are also dependent upon the specific equipment (e.g., sealing device 114) but processes can be developed for determining the optimum sealing power and speed under testing conditions which can then be used in the manufacturing conditions.

The exemplary oxygen controlled atmosphere sintering process 210 (steps 8a-8f) is described in more detail next to help further explain why these temperatures and times had been used with this particular frit 108 and glass plate 102. The lower hold temperature of 325° C. associated with step 304 was selected to volatilize the organic ingredients of the dispersant vehicle while remaining below the Tg of the frit's glass such that the glass does not flow on top of the glass plate 102. The hold time of 1 hour and 8 minutes associated with step 304 (which could be shortened) was selected to give the dispersant vehicle time to volatilize and burn off organic components that are used to suspend the glass frit components for the dispensing step 206, and during the last 20 minutes, the $N_2$ supply is turned on so that $N_2$ at least partially displaces the air before the top temperature (e.g., glass $T_g$) is reached in step 306. The $N_2$ helps to prevent the oxidation of the vanadium (or other transition metal or lanthanide) in the frit's glass from the oxygen in the air so that the glass is durable and has an enhanced absorption property at the specific wavelength (e.g., 810 nm wavelength) of the light 116 (e.g., laser beam 116) emitted from the sealing device 114 (e.g., laser 114). Alternatively, a reducing gas like hydrogen can be used instead of the inert gas to reduce the vanadium (or other transition metal or lanthanide) in the frit's glass so that the glass is durable and has an enhanced absorption property at the specific wavelength (e.g., 810 nm wavelength) of the light 116 emitted from the sealing device 114.

The higher hold temperature at step 308 was 400° C. but it could be between 385° C. and 415° C. to avoid a problematical devitrification of the frit 108. The hold time at step 308 was set at 1 hour, but additional experiments have shown that this hold time could be ≦30 minutes. In fact, the ramp rates and holds aspects of this exemplary sintering process 210 (steps 8a-8f) were generally set in view of the oven design, load in the furnace, and physics of conduction to transfer heat from the glass plate 102 to the frit 108. If desired, the ramp rates and hold times could be changed to be slower and sometimes faster.

At the higher hold temperature of step 308, the oxygen level content within the oven is preferably maintained at a predetermined level somewhere within a range of about 1,200 ppm-22,220 ppm in accordance with an embodiment of the present invention. The minimum range of 1,200 ppm of oxygen was established because there are drawbacks for using oxygen levels less than this at say 50 ppm-1000 ppm during the sintering step 210 even though these extremely low oxygen levels would work to control the vanadium oxidation state in the exemplary vanadium-doped glass frit 108 which helps control how well the sintered frit 108 absorbs the 810 nm light 116 that is emitted from the sealing device 114. Some of the drawbacks associated with the use of these extremely low oxygen levels are as follows:

It is technically difficult to displace all of the air in an oven with N2 to reduce the $O_2$ level to be below 1000 ppm.

Extremely low $O_2$ levels require expensive and exacting sintering ovens and equipment which basically need to be able to keep the air out.

Extremely low $O_2$ levels require the use of expensive bottled ultra-pure $N_2$ (or other inert gas such as He or reducing agents such as forming gas or $H_2$) since this is what would be needed to displace the air which is used in the first half of the sintering schedule 210 (steps 8a-8b). The less expensive "house" $N_2$ may not be used in the extremely low oxygen levels since it may not be pure enough to displace the air that is used in the first half of the sintering schedule 210 (steps 8a-8b). Plus, the use of expensive bottled ultra-pure $N_2$ also require additional handling which would not be needed if the less expensive "house" $N_2$ could be used like it can in the present invention where the higher oxygen level content of about 1,200 ppm-22,220 ppm is maintained.

Thus, the higher oxygen level content of about 1,200 ppm-22,220 ppm is preferable and it also appears to result in the formation of a good seal 112 (hermetic seal 112) within the sealed glass package 100 (see TABLE #1). The particular oxygen level content (which directly relates to the level of the inert gas or reducing agent, i.e. $N_2$, where the more $O_2$ then the less $N_2$ and vice versa) that is used within the oven is important since it helps control the V oxidation state in the exemplary vanadium-doped glass frit 108 which helps control how well the sintered frit 108 absorbs the 810 nm light 118 (or other light such as 913 nm) that is emitted from the sealing device 114. Generally, the desired oxygen level content within the oven can be selected based on the type of sealed glass package 100 that is being manufactured. For instance, if one is manufacturing a sealed glass package 100 with higher temperature lead components 104, then this manufacturer could tolerate higher sealing power (resulting in higher temperature) and as such higher oxygen levels can be used in the sintering step 210 to reduce manufacturing costs. However if one is manufacturing a certain sealed glass package 100 that has low temperature lead components 104, then one would want to spend more money to obtain low oxygen levels during sintering step 210 to be able to have a subsequent sealing step 216 with the lowest possible power and temperature.

Figure 4:
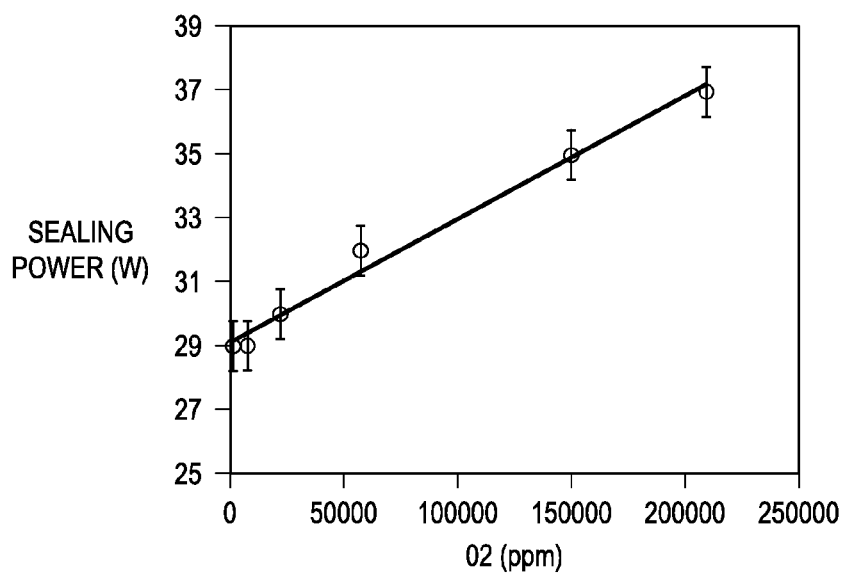
FIG. 4 is graph that illustrates the relationship of the oxygen level used during a sintering step in the method of FIG. 2 to the sealing power used during a sealing step in the method of FIG. 2 in accordance with an embodiment of the present invention.

Referring to FIG. 4, there is a graph that illustrates the relationship of the oxygen level in the sintering step 210 to the sealing power in the sealing step 216 that was determined by an experimental analysis in accordance with an embodiment of the present invention. The indicated oxygen level is a result of averaging 60 measurements that were taken once a minute during the one hour hold at 400° C. in the sintering process 210 (step 8d). The highest value of 21% is the $O_2$ that is in air (the $N_2$ was not turned on during that run). The sealing power is that which is determined to exhibit the best seal quality with the main criterion being a seal width ≧75% of the frit 108. However, it should be appreciated that the seal width ≧75% is not required for a good seal so long as the seal width is continuous around the path of the frit 108. Each optimum sealing window is about ±1 watt. In generating these measurements, the sealing conditions were the same for each of the runs (10 mm/sec speed, defocus 7.6 mm beam shape, 810 nm wavelength, round magnets applied force to both glass plates 102 and 110, the laser start/stop, etc.). Only the sealing power was changed for the sealing device 114 which was an 810 nm laser diode 114. The same frit, glass sheet type, frit profile, deposition speed, pattern on the 6"×6" glass sheets, etc. were also used, and all of the samples were dispensed consecutively (randomized for the runs) when obtaining this information. At the conclusion of this experiment, it was seen that there was no significant difference between the sealing power and the seal quality for an $O_2$ level between 1,200 ppm (0.12%) and 22,220 ppm (2.2%). This signifies the following:

1. Rather than needing extremely low oxygen content in the range of 50 ppm (0.005%) during the sintering step 210 the $O_2$ level can in fact be as high as 22,200 ppm (2.2%).

2. The seal quality was good for the entire range of $O_2$.

3. The linear relationship of $O_2$ with sealing power enables the manufacturer to predict what the sealing power will be as a function of the $O_2$ level or vice versa where the sealing power=0.4(% $O_2$)+29 while the 29 is the y-intercept for this experimental data, it could be generalized as the lowest sealing power for the lowest $O_2$ level.

4. The higher $O_2$ (more air) level means there will be lower operating expenses for energy when operating the oven.

5. The larger range of $O_2$ levels loosens the manufacturing specification which makes it easier to make the sealed glass packages 100.

6. Knowing the $O_2$ level's impact on laser sealing power needed for a proper seal 112 allows the manufacturing personnel to customize the equipment for a particular sealed glass package 100.

7. The higher $O_2$ level does not adversely affect the quality of the frit seals 112 in the sealed glass packages 102. In these experiments, it was found that the hermetic frit seal 112 in the sealed glass package 100 that was made using an 810 nm sealing device 114 had a dark brown color which was found to be indicative of an efficient and cohesive seal. It is believed the hermetic seal 112 has a dark brown-black colored frit 108 because of the presence of a reduced vanadium species such as $V^{+3}$ in the frit 108 that is caused by the non-oxidizing or reducing conditions (through the use of an inert gas or reducing gas) during sintering. As discussed above, the reduced vanadium species absorbs more 810 nm light 118 from the sealing device 114 than a non-reduced vanadium species in the frit 108.

8. The higher level of $O_2$ permits the oven to be of a different type than is needed with the extremely low oxygen level. For example, the extremely low oxygen level requires the use of a specifically designed, tightly sealed inert gas type oven whereas the higher level of oxygen permits the use of a less expensive more standard designed electric, gas or infrared oven. Plus, the higher level of oxygen permits the use of a continuous type sintering oven with belts, pushers and lehrs that can be used to sinter the frit 108 and glass plate 102. For instance, the continuous type sintering oven can have two different zones through which the frits 108 and glass plates 102 travel where there is one zone with enough oxygen (~20%) to completely burnout the organic binder used to dispense the frit 108 (see step 206) and another zone with a lower oxygen level used to sinter the frit 108 and glass plate 102 (see step 210). The higher oxygen levels associated with the sintering step 210 of the present invention allows for less expensive, simpler and shorter continuous type furnaces.

9. The higher level of $O_2$ permits the oven to be larger which is desirable if the sintering process 210 is a batch process. Plus, the larger oven is desirable since the atmosphere therein can replenished regularly and circulated as the frits 108 and glass plates 102 are heated, and it does not need to be as carefully controlled as would be needed if there was an extremely low oxygen content which means it is not easily subject to an "upset" which would disrupt a manufacturing process and add cost since the fritted glass plates would have to be discarded.

The results of the particular experiment associated with FIG. 4 are as follows:

TABLE #1

| Oygen Level at Sintering Step (%) | Laser Type | Laser Wavelength (nm) | Sealing Speed (mm/sec) | Defocus (mm) | Optimum Sealing Power (W) |
|---|---|---|---|---|---|
| 0.12 | Laser Diode | 810 | 20 | 7.6 | 29 |
| 0.12 | Laser Diode | 810 | 20 | 7.6 | 29 |
| 0.12 | Laser Diode | 810 | 20 | 7.6 | 29 |
| 0.12 | Laser Diode | 810 | 20 | 7.6 | 29 |
| 0.12 | Laser Diode | 810 | 20 | 7.6 | 29 |
| 0.74 | Laser Diode | 810 | 20 | 7.6 | 29 |
| 0.74 | Laser Diode | 810 | 20 | 7.6 | 29 |
| 2.22 | Laser Diode | 810 | 20 | 7.6 | 30 |
| 2.22 | Laser Diode | 810 | 20 | 7.6 | 30 |
| 2.22 | Laser Diode | 810 | 20 | 7.6 | 30 |
| 2.22 | Laser Diode | 810 | 20 | 7.6 | 30 |
| 2.22 | Laser Diode | 810 | 20 | 7.6 | 30 |
| 5.75 | Laser Diode | 810 | 20 | 7.6 | 32 |
| 5.75 | Laser Diode | 810 | 20 | 7.6 | 32 |
| 15.00 | Laser Diode | 810 | 20 | 7.6 | 35 |
| 20.90 | Laser Diode | 810 | 10 | 7.6 | 37 |
| 20.90 | Laser Diode | 810 | 10 | 7.6 | 37 |
| 20.90 | Laser Diode | 810 | 10 | 7.6 | 37 |
| 20.90 | Laser Diode | 810 | 10 | 7.6 | 37 |
| 20.90 | Laser Diode | 810 | 10 | 7.6 | 37 |
| 20.90 | Laser Diode | 810 | 10 | 7.6 | 37 |

In this particular experiment the following conditions were followed:

Sealing Power: 29-37 W

Speed: 20 mm/sec (note: the 20.90 samples were sealed at 10 mm/sec.).

Beam shape: Its thermal profile is a parabola, with its maximum centered within the middle of the frit.

Wavelength: 810 nm

Applied force: a weight is put in the middle of each sample.

Laser start/stop: goes onto sample at the same spot that it leaves the sample.

Frit: Sb—V-phosphate glass, β-eucryptite filler, and a dispersant vehicle that is a blend of 2,2,4-trimethyl-1,3-pentadiol monoisobutyrate (80.5% wt) (brandname of Texanol) and other dispersants including Anti-Terra 202 (6.5% wt), BYK 354 (6.5% wt), Solsperse 9000 (6.5% wt) and ethylcellulose (1.5% wt).

Glass: Eagle 2000 glass

Profile: Mesa

Frit Height: 12-16 microns

Frit Width: 0.7 mm wide

Dispensing speed: 50 mm/sec

Pattern Dimension on 6×6: 27 mm×30 mm

Of course, there are many different speeds, powers, wavelengths, frit compositions, glass types, etc. . . that could be used in accordance with an embodiment of the present invention to make a sealed glass package 100 which would work just as well as the exemplary experimental frit, glass plate, sealing device etc. . . . Accordingly, the present invention should not be construed as being limited to any specific type of frit, glass plate, sealing device etc. . .

Although multiple embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

The invention claimed is:

1. A sealed glass package comprising:
   a first glass plate; and
   a second glass plate, wherein the first glass plate and the second glass plate are connected to one another by a transition metal-lanthanide doped glass frit which formed a seal between the first glass plate and the second glass plate, wherein the transition metal-lanthanide doped glass frit has a predetermined color and desired oxidation state due to a using an 1,200 ppm-22,220 ppm oxygen controlled sintering process which was performed to attach the transition metal-lanthanide doped glass frit to the first glass plate before the second glass plate was placed on top of the sintered transition metal-lanthanide doped glass frit and the sintered transition metal-lanthanide doped glass frit was melted to form the seal between the first glass plate and the second glass plate.

2. The sealed glass package of claim 1, wherein said transition metal-lanthanide doped glass frit which forms the seal has a brown color.

* * * * *